United States Patent
Kim et al.

(10) Patent No.: US 7,777,324 B2
(45) Date of Patent: Aug. 17, 2010

(54) INTERPOSER AND SEMICONDUCTOR PACKAGE WITH REDUCED CONTACT AREA

(75) Inventors: Hong-Kweun Kim, Ansan-si (KR);
June-Hyeon Ahn, Suwon-si (KR);
Ki-Hyun Kim, Suwon-si (KR);
Seok-Myong Kang, Hwaseong-si (KR);
Youn-Ho Choi, Suwon-si (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 698 days.

(21) Appl. No.: 11/672,634

(22) Filed: Feb. 8, 2007

(65) Prior Publication Data

US 2008/0029871 A1 Feb. 7, 2008

(30) Foreign Application Priority Data

Aug. 4, 2006 (KR) .................. 10-2006-0073867

(51) Int. Cl.
*H01L 23/52* (2006.01)
*H05K 1/00* (2006.01)
(52) U.S. Cl. .............. 257/690; 257/E23.141; 257/E21.001; 257/668; 257/774; 257/773; 257/698; 257/691; 257/784; 438/106; 174/250
(58) Field of Classification Search ............... 257/690, 257/E21.001, E23.141, 668, 774, 773, 698, 257/691, 784; 438/106; 174/250
See application file for complete search history.

(56) References Cited

U.S. PATENT DOCUMENTS 6,333,562 B1 * 12/2001 Lin ....................... 257/777
7,193,329 B2 * 3/2007 Takahashi ................ 257/781
7,217,998 B2 * 5/2007 Tamagawa et al. .......... 257/707
7,361,844 B2 * 4/2008 Vinciarelli et al. .......... 174/260
7,411,292 B2 * 8/2008 Chen et al. ................ 257/724
2001/0007288 A1 * 7/2001 Brofman et al. ............ 174/260
2002/0142513 A1 * 10/2002 Fee et al. .................. 438/106
2003/0153122 A1 * 8/2003 Brooks .................... 438/107
2004/0100778 A1 * 5/2004 Vinciarelli et al. .......... 361/760
2007/0013084 A1 * 1/2007 Kinsman .................. 257/786
2007/0170573 A1 * 7/2007 Kuroda et al. .............. 257/686
2007/0187814 A1 * 8/2007 Cusack et al. .............. 257/723
2008/0023853 A1 * 1/2008 Moden ..................... 257/784
2008/0150110 A1 * 6/2008 Kim ........................ 257/685
2008/0285244 A1 * 11/2008 Knickerbocker ............ 361/760

FOREIGN PATENT DOCUMENTS

| JP | 2002-83900 | | 3/2002 |
| JP | 2006-6351664 A | * | 12/2006 |
| KR | 2000-22978 | | 4/2000 |
| KR | 2003-65351 | | 8/2003 |

* cited by examiner

*Primary Examiner*—Alexander O Williams
(74) *Attorney, Agent, or Firm*—Cha & Reiter, LLC

(57) ABSTRACT

Disclosed is an interposer including a polyhedral body having first and second surfaces facing each other, a plurality of electric terminals formed on the first surface; and a plurality of vias extending through the first and second surfaces. In addition, a semiconductor package includes a printed circuit board having a plurality of electric contacts formed on an upper surface and an interposer having first and second surfaces facing each other, vias extending through the first and second surfaces, and first electric terminals formed on the first surface. The interposer is seated on the printed circuit board so that the vias correspond to the electric contacts.

13 Claims, 8 Drawing Sheets

US 7,777,324 B2

INTERPOSER AND SEMICONDUCTOR PACKAGE WITH REDUCED CONTACT AREA

CLAIM OF PRIORITY

This application claims the benefit, pursuant to 35 USC 119, to that patent application entitled "Interposer and Semiconductor Package Using the Same," filed with the Korean Intellectual Property Office on Aug. 4, 2006 and assigned Serial No. 2006-73867, the contents of which are incorporated herein by reference.

BACKGROUND OF THE INVENTION

1. Field of the Invention

The present invention relates to a bonding structure between a semiconductor die and a PCB (printed circuit board), and more particularly to a semiconductor package having a semiconductor die and a PCB adapted for a high level of integration.

2. Description of the Related Art

FIG. 1 is a cross sectional view showing a semiconductor package 10, which has a semiconductor die stacked 15 on a PCB 20 through a die bonding process and electrically connected to the PCB by means of wire bonding 25.

The semiconductor die 15 is seated on the upper surface of the PCB 20, and one side of a wire bonding pad is electrically connected to the upper surface 30 of the semiconductor die by means of ball bonding 35. The opposite side of the wire bonding pad is electrically connected to the PCB by means of stitch bonding 40.

FIG. 2 is a top view of a semiconductor package 100 having a semiconductor die 120 seated on a PCB 110. The conventional semiconductor package 100 shown in FIG. 2 is obtained by seating the semiconductor die 120 on the PCB 110 and electrically connecting them by wires 121.

The interval between portions of the wires 121 bonded to the PCB 110 by stitch bonding 111 is larger than that between portions ball-bonded to the semiconductor die 120. This results from restrictions concerning the fabrication of patterns on the PCB 110 and the bending characteristics of the wires 121. As such, the wires 121 are generally arranged in a fan-shaped configuration.

Although the die bonding process is aimed at minimizing the volume of the semiconductor package and providing a compact product, the fan-shaped configuration of the wires for electrically connecting the semiconductor die to the PCB causes spatial restrictions (e.g. arrangement of components).

SUMMARY OF THE INVENTION

Accordingly, the present invention has been made to solve the above-mentioned problems occurring in the prior art and provides additional advantages, by providing a semiconductor package having simple wirings between a semiconductor die and a PCB so that components can be arranged easily even in a small volume.

In one embodiment, there is provided an interposer including a polyhedral body having first and second surfaces facing each other; a plurality of electric terminals formed on the first surface and a plurality of vias extending through the first and second surfaces.

In accordance with another aspect of the present invention, there is provided a semiconductor package including a printed circuit board having a plurality of electric contacts formed on an upper surface and an interposer having first and second surfaces facing each other, vias extending through the first and second surfaces, and first electric terminals formed on the first surface, the interposer being seated on the printed circuit board so that the vias correspond to the electric contacts.

BRIEF DESCRIPTION OF THE DRAWINGS

The above features, and advantages of the present invention will be more apparent from the following detailed description taken in conjunction with the accompanying drawings, in which.

DETAILED DESCRIPTION

Hereinafter, embodiments of the present invention will be described with reference to the accompanying drawings. In the following description of the present invention, a detailed description of known functions and configurations incorporated herein is omitted to avoid making the subject matter of the present invention unclear.

Figure 1:
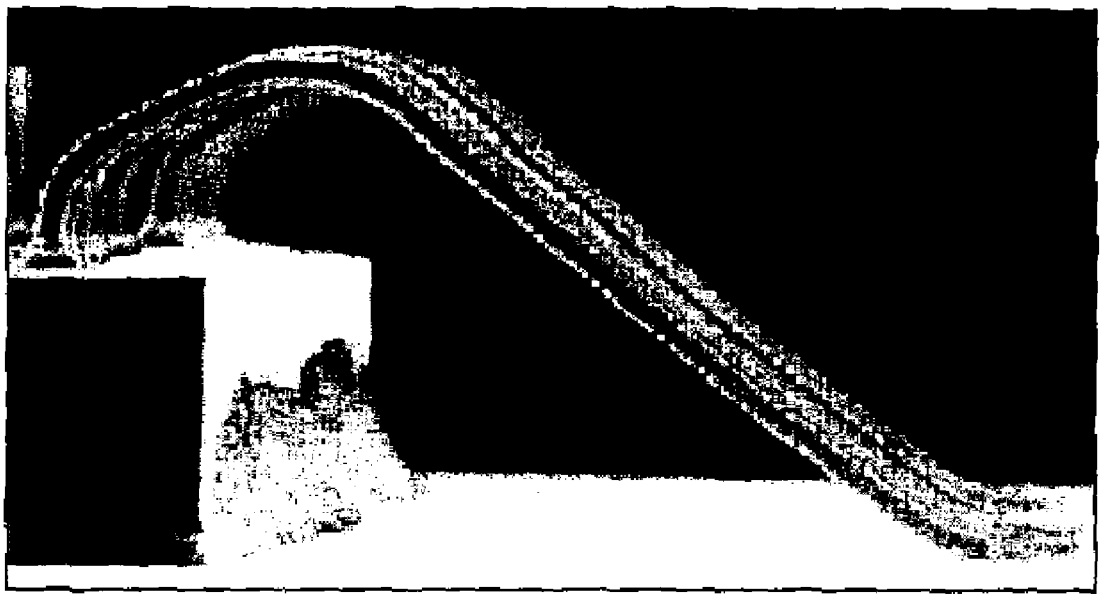
FIG. 1 is a cross-sectional view showing a semiconductor package having a semiconductor die and a PCB electrically connected to each other according to the prior art.
Figure 2:
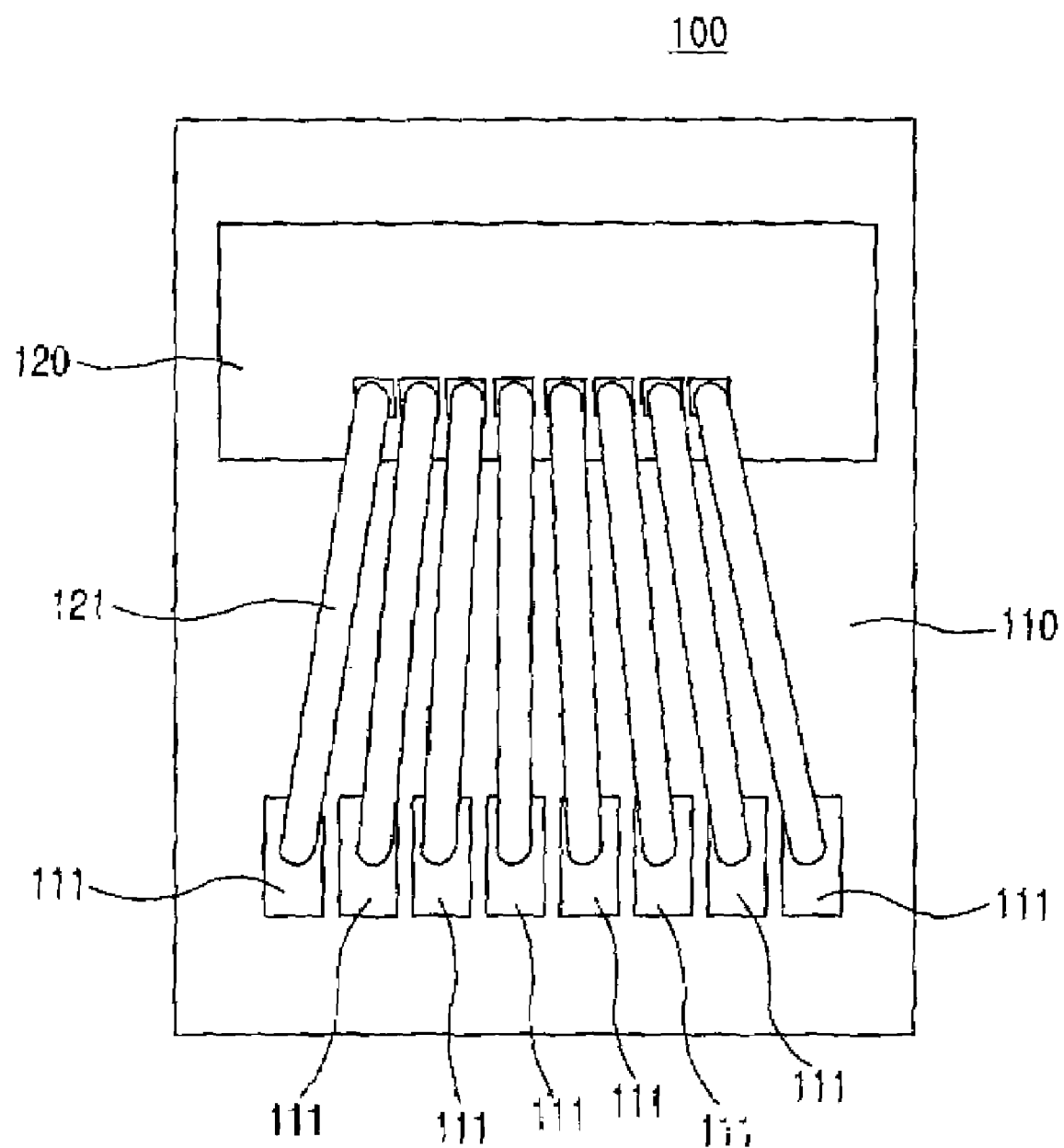
FIG. 2 is a top view of the conventional semiconductor package shown in FIG. 1.
Figure 3:
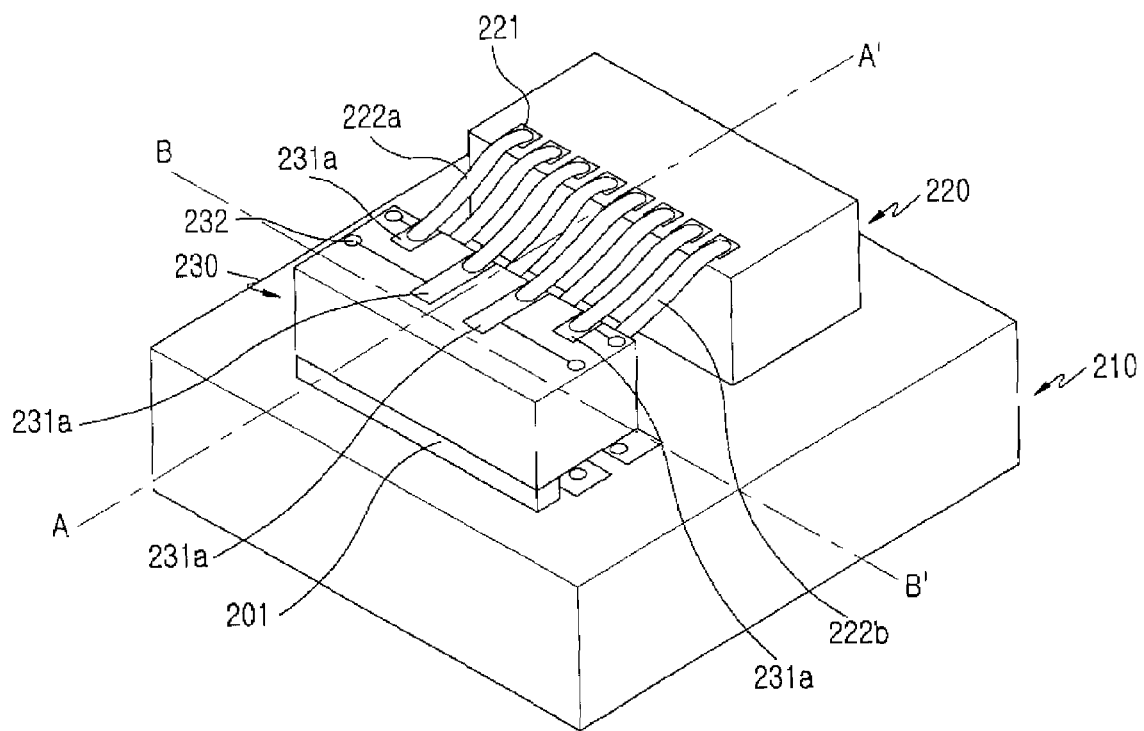
FIG. 3 is a perspective view showing a semiconductor package according to a preferred embodiment of the present invention.
Figure 4:
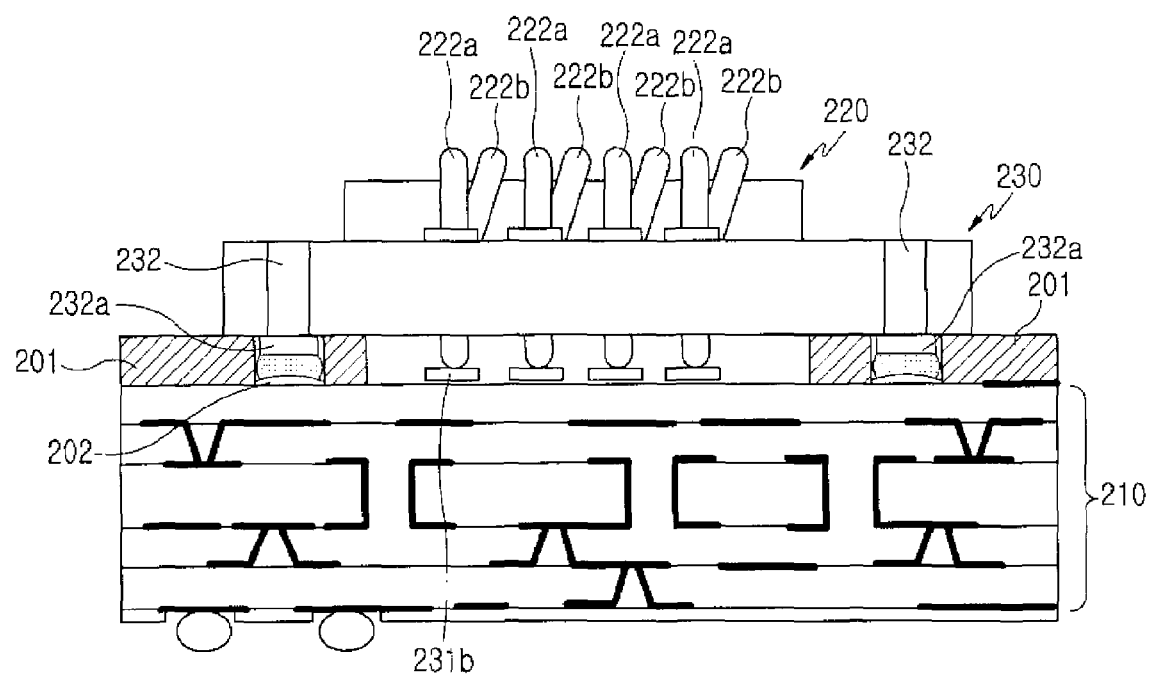
FIG. 4 is a sectional view taken along line B-B' of the semiconductor package shown in FIG. 3.
Figure 5:
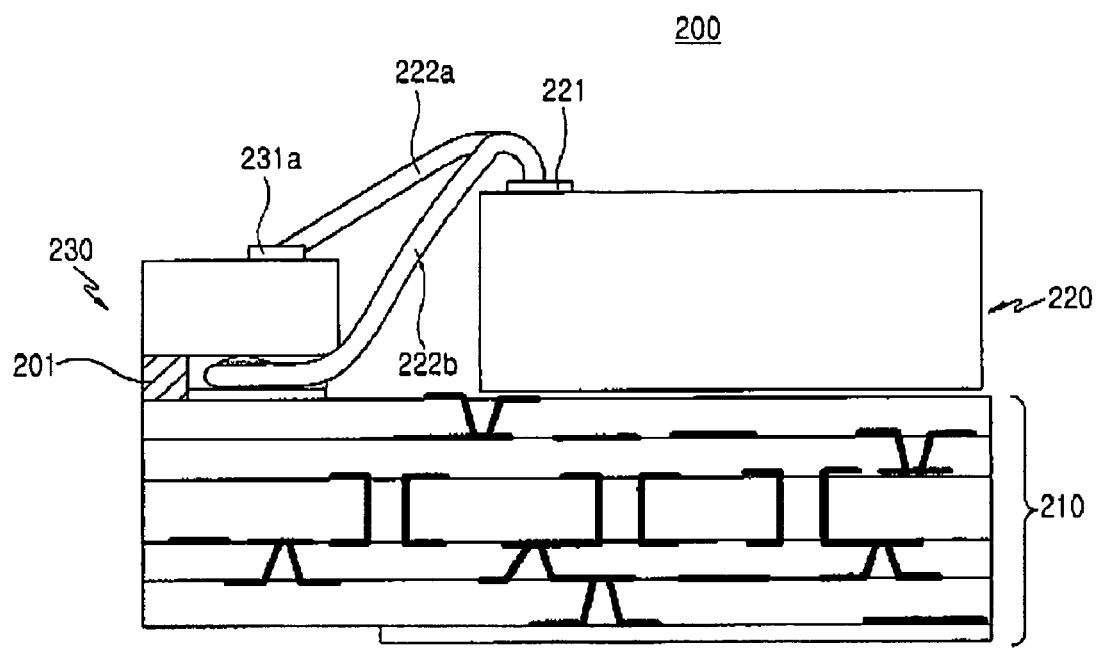
FIG. 5 is a sectional view taken along line A-A' of the semiconductor package shown in FIG. 3.
Figure 6:
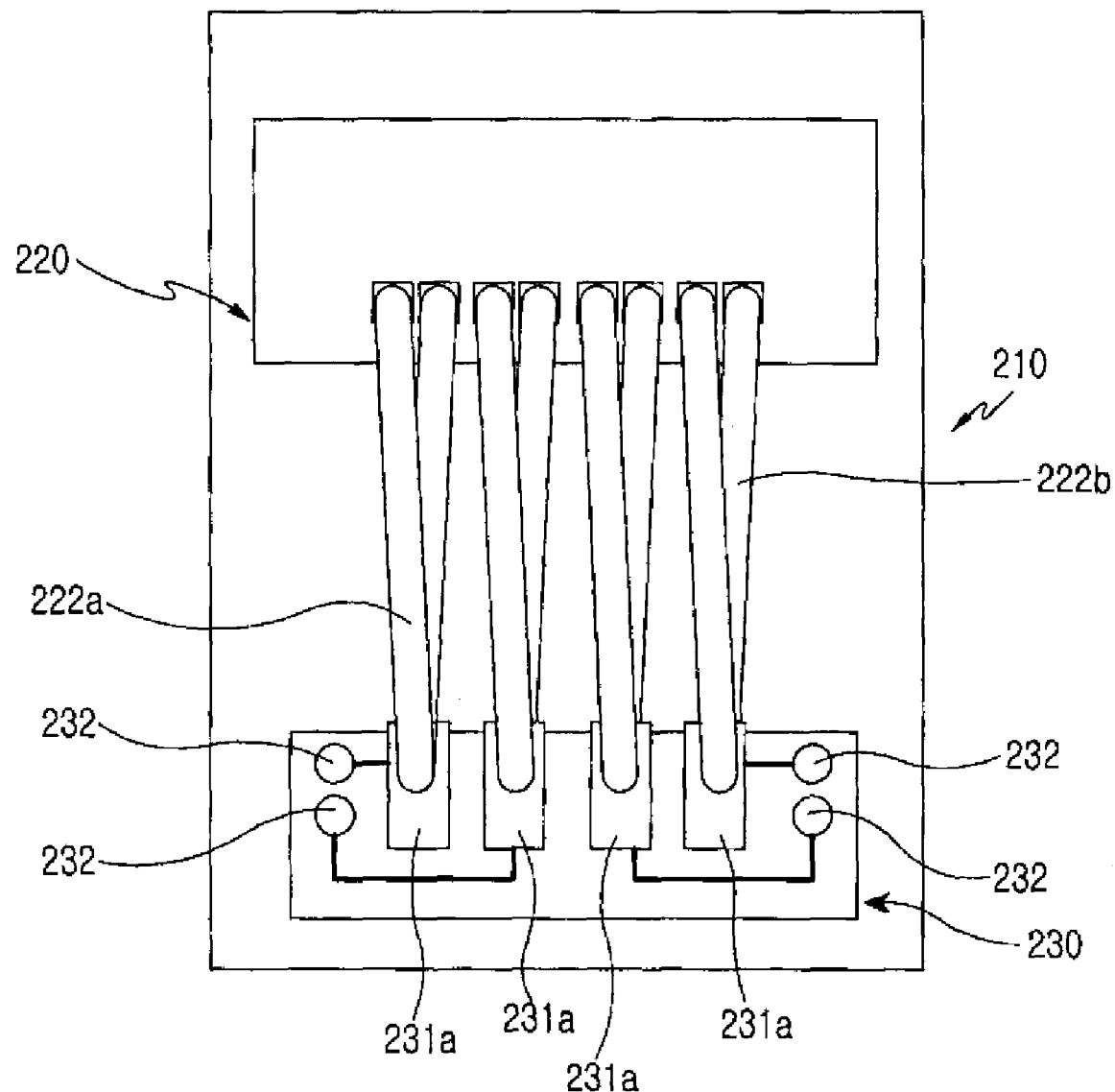
FIG. 6 is a top view of the semiconductor package shown in FIG. 3.

FIG. 3 is a perspective view showing a semiconductor package according to a preferred embodiment of the present invention. FIG. 4 is a sectional view taken along line B-B' of the semiconductor package shown in FIG. 3. FIG. 5 is a sectional view taken along line A-A' of the semiconductor package shown in FIG. 3. FIG. 6 is a top view of the semiconductor package shown in FIG. 3. Referring to FIG. 3, the semiconductor package 200 according to the present embodiment includes a PCB 210 having a plurality of electric contacts 202 (not shown), an interposer 230, a semiconductor die 220, and a support member 201 inserted between the interposer 230 and the PCB 210. With reference to FIG. 4, the position of the electrical contacts 231b with regard to the PCB 210 and interposer 230. With reference to FIG. 5, the wiring 222a and 222b, above and below, respectively, interposer 230 is shown. With reference to FIG. 6, the interweaving of the wiring 222a and 222b with regard to the interposer in accordance with the principles of the invention.

Figure 8:
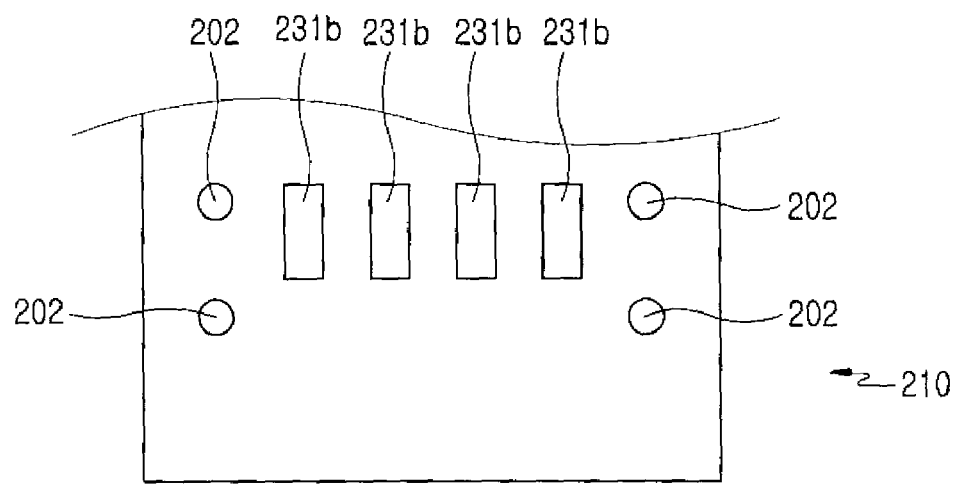
FIG. 8 is a top view of the upper surface of a PCB shown in FIG. 3.

FIG. 8 is a top view of the upper surface of PCB 210 shown in FIG. 3. The PCB 210 shown in FIG. 8 includes a plurality of first electrical contacts 202 and second electrical 231b. The interposer 230 and the semiconductor die 220 are seated on the PCB 210. The first electrical contacts 202 and second electrical contact 231b are formed on the upper surface of the PCB 210, on which the interposer 230 is seated.

Returning to FIG. 3, selected ones of the second electric terminals 221 on semiconductor die 220 are electrically connected to the electric terminals 231a via first wires 222a, and the remaining second electric terminals 221 are electrically connected to the second electric contacts 231b (FIG. 8) via second wires 222b. The first and second wires 222a and 222b are electrically connected by stitch bonding or wire bonding.

The first and second wires 222a and 222b may be wire-bonded by a capillary, which preferably is a high-precision ceramic-processed product and is used to attach gold wires for connecting a semiconductor die to a lead frame. The second wires 222b, which are connected to the second electric contacts 231b, may be formed so as to abut the bottom along the movement trajectory of the capillary. The thickness of the support member (particularly, solder resist) 201 may be similar to that of the bonded second wires 222b so that when the interposer 230 is seated the second wires 222b are not compressed.

Figure 7:
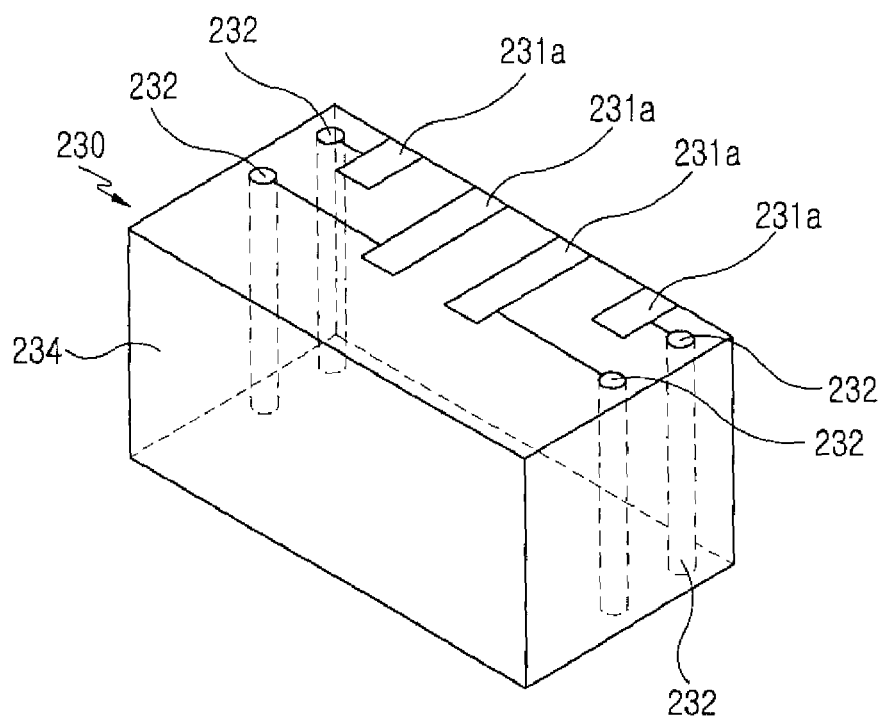
FIG. 7 is a perspective view of an interposer shown in FIG. 3.

Referring to FIG. 7, which is a perspective view of the interposer shown in FIG. 3, the interposer 230 includes a polyhedral body 234 having first and second surfaces facing each other, vias 232 extending through the first to the second surfaces, and first electric contacts 231a formed on the first surface.

The interposer 230 is seated on the PCB 210 so that the vias 232 are electrically connected to the corresponding first electric contacts 202.

Figure 9:
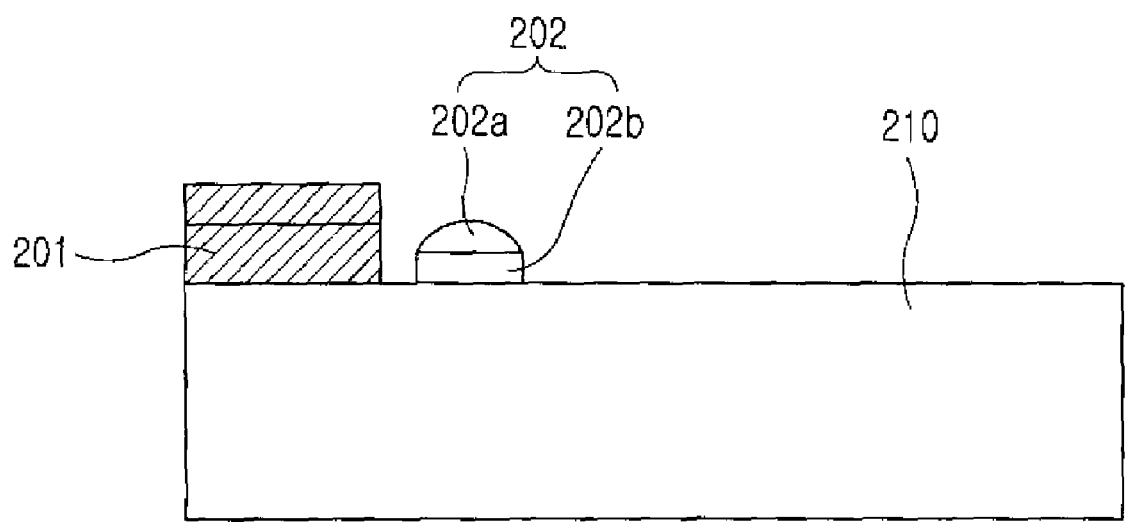
FIG. 9 is a partial sectional view of the PCB shown in FIG. 3.
Figure 10:
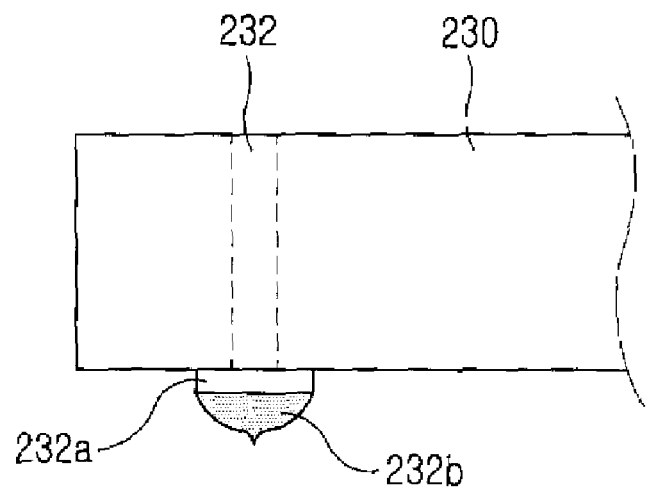
FIG. 10 is a partial sectional view of the interposer shown in FIG. 3.

FIG. 9 is a partial sectional view of the PCB shown in FIG. 3, and FIG. 10 is a partial sectional view of the interposer shown in FIG. 3. The second electric contacts 202 are electrically connected to the corresponding vias 232 via stud bumpers, which are preferably made of a gold material. Referring to FIGS. 9 and 10, each second electric contact 202 includes an electrode 202b made of gold and a solder bumper 202a formed on the electrode 202b. Each hole 232 is provided with an electrode 232a having a shape corresponding to that of the facing second electric contact 202 and a solder bumper (gold stud bump) 232b.

After aligning the solder bumpers 202a and (gold stud bump) 232b so that they abut each other, the second electric contacts 202 are completely bonded to the vias 232 through a heat treatment process (i.e. reflow).

The support member 201, which preferably is a type of solder resist, is positioned between the second electric contacts 202 so as to prevent the solder bumpers 202a and (gold stud bump) 232b from melting excessively during a heat treatment process (e.g. reflow) and electrically connecting to other adjacent second electric contacts. Preferably, the thickness of the support member 201 is larger than that of the solder bumpers 202a and 232b.

The semiconductor die 220 has a plurality of second electric terminals 221, some of which are electrically connected to the first electric terminals 231a, and the remaining second electric terminals 221 are connected to the bonding pad-type second electric contacts 231b.

As mentioned above, the semiconductor package including a semiconductor die according to the present invention is advantageous in that, by electrically connecting a PCB to the semiconductor die via an interposer electrically connected to the semiconductor die, wiring to an external input/output pin can be easily made, in terms of routing, through rewiring.

While the invention has been shown and described with reference to certain preferred embodiments thereof it will be understood by those skilled in the art that various changes in form and details may be made therein without departing from the spirit and scope of the invention as defined by the appended claims.

What is claimed is:

1. An interposer for connecting a semiconductor die to a printed circuit board, the interposer comprising:
    a polyhedral body having top and bottom surfaces;
    a plurality of electric terminals formed on the top surface; and
    a plurality of vias extending through the top surface to the bottom surface; and
    wherein the semiconductor die and the interposer are laterally spaced from each other and seated on the printed circuit board, first and second wires are extended from the semiconductor die, the first wires are connected to the electric terminals, and the second wires are connected directly to the printed circuit board.

2. A semiconductor package comprising:
    a printed circuit board having a plurality of electric contacts formed on an upper surface;
    first and second wires extended from a semiconductor die; and
    an interposer positioned on the printed circuit board, said interposer comprising:
    a first and second surfaces;
    a plurality of vias extending through the first surface to the second surfaces;
    first electric terminals formed on the first surface, wherein the vias correspond to selected ones of the electric contacts; and
    wherein the semiconductor die and the interposer are laterally spaced from each other and seated on the printed circuit board, the first wires are connected to the first electric terminals, and the second wires are connected directly to the printed circuit board.

3. The semiconductor package as claimed in claim 2, wherein the interposer is seated so that the second surface faces the upper surface of the printed circuit board.

4. The semiconductor package as claimed in claim 2, wherein the electric contacts comprises:
    first electric contacts formed on the printed circuit board so as to correspond to the vias one to one; and
    second electric contacts connected to the second wires.

5. The semiconductor package as claimed in claim 2, further comprising the semiconductor die having a plurality of second electric terminals.

6. The semiconductor package as claimed in claim 5,
    wherein the first wires electrically connect a group of the second electric terminals to the first electric terminals, and
    the second wires electrically connect remaining second electric terminals to the second electric contacts.

7. The semiconductor package as claimed in claim 6, wherein the first and second wires are electrically connected by stitch bonding.

8. The semiconductor package as claimed in claim 6, wherein the first and second wires are electrically connected by wire bonding.

9. A method of attaching a semi-conductor die to a printed circuit board (PCB) having a plurality of electric contacts, said method comprising the steps of:
    directly connecting selected ones of electric terminals on said semiconductor die to selected ones of the electric contacts of said PCB using first wire;
    positioning an interposer on said PCB, a part of said interposer positioned above and electrically isolated from said wire bonded PCB terminals;
    connecting remaining ones of said electric terminals of said semi-conductor die to electric terminals positioned on said interposer using second wires; and electrically connecting remaining electric terminals of said interposer to remaining electric contacts of said PCB;

wherein the semiconductor die and the interposer are laterally spaced from each other and seated on the PCB.

10. The method of claim 9, wherein said interposer containing a plurality of vias through which said interposer electric terminals are electrically connected to said PCB electric contacts.

11. The method of claim 9, wherein said interposer electric terminals are vertically disposed from said PCB electric contacts.

12. The method of claim 9, wherein the first and second wires are alternately disposed on the semiconductor die.

13. The semiconductor package as claimed in claim 2, further comprising a support member arranged at a lower portion of the interposer between the interposer and the printed circuit board, wherein said support member defines a space between the interposer and the printed circuit board along a central area of the interposer for electrical connection of the semiconductor die to the printed circuit board within said space by the second wires that are received laterally from the semiconductor die.

* * * * *